United States Patent
Ott et al.

(10) Patent No.: US 6,645,877 B2
(45) Date of Patent: Nov. 11, 2003

(54) METHOD OF OPERATING A PROCESSING CHAMBER HAVING MULTIPLE STATIONS

(75) Inventors: Andrew Ott, Hillsboro, OR (US); Jennifer L. O'Loughlin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 33 days.

(21) Appl. No.: 10/059,903

(22) Filed: Jan. 28, 2002

(65) Prior Publication Data

US 2003/0143823 A1 Jul. 31, 2003

(51) Int. Cl.⁷ ............................................... H01L 21/31
(52) U.S. Cl. ........................ 438/758; 438/800; 414/935; 414/937
(58) Field of Search ................................. 438/758, 800; 414/935, 937

(56) References Cited

U.S. PATENT DOCUMENTS 6,449,520 B1 * 9/2002 Lin et al. ..................... 700/97
6,580,955 B2 * 6/2003 Lin et al. ..................... 700/97

* cited by examiner

Primary Examiner—Alexander Ghyka
(74) Attorney, Agent, or Firm—Blakely, Sokoloff, Taylor & Zafman LLP

(57) ABSTRACT

A method for operating a multi-station processing chamber is described. A wafer is loaded onto the first station then indexed to the second station prior to processing. The indexing causes the wafer to be well-seated on it spindle before being processed. This prevents an improperly seated wafer from being processed at the first station.

25 Claims, 2 Drawing Sheets

US 6,645,877 B2

METHOD OF OPERATING A PROCESSING CHAMBER HAVING MULTIPLE STATIONS

FIELD OF THE INVENTION

This invention relates to the field of processing equipment for the fabrication of an integrated circuit.

PRIOR ART

In the fabrication of integrated circuits, a semiconductor wafer is subjected to many deposition steps. In some cases, a single deposition chamber with a single station many not have a sufficiently high run-rate to deposit a particular layer for a fabrication line. Multiple chambers can be used, for instance, each of which includes a chemical vapor deposition (CVD) stations for depositing a particular layer of dielectric on the wafers. When multiple chambers are used for a given layer, the chambers must be carefully balanced so that each provides the same film thickness. Otherwise the performance of some wafers may be different than others because some wafers will have thicker layers than others. This also is true where multiple stations are used in a single chamber and the entire thickness of a given layer is deposited at each station.

One class of equipment eliminates the need for balancing each station. This equipment uses several stations in the same chamber to sequentially complete a single deposition step by doing part of the step at each station. For instance, a layer may be deposited at four stations where one-fourth the total thickness of the layer is deposited at each of the four stations. All stations operate simultaneously on different wafers with each wafer being passed from one station to the next. This is akin to a serial production line and results in a run-rate approaching what can be achieved by having multiple chamber with single stations. One such deposition chamber with multiple stations is manufactured by Novellus and sold under the trademark "Vector." A problem associated with this multiple station chamber is discussed in the detailed description which follows along with the solution provided by embodiments of the present invention.

DETAILED DESCRIPTION

A method for operating a multiple station processing chamber for semiconductor wafer processing is described. In the following description, numerous specific details concerning the operation of the chamber of FIG. 1 are not set forth since they are well known in the prior art and may obscure the present invention.

Figure 1:
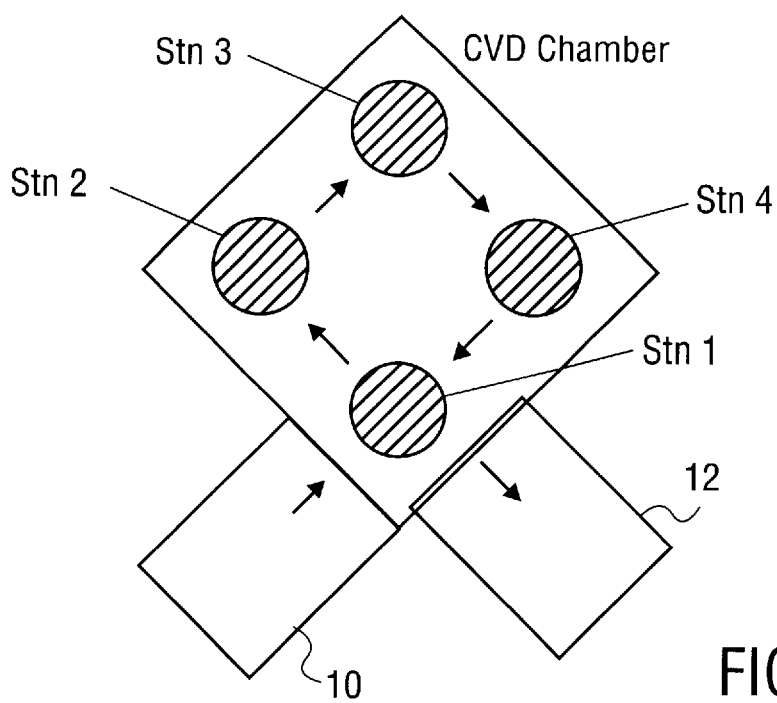
FIG. 1 is a plan view of a multiple station CVD chamber.

Referring first to FIG. 1, the CVD chamber comprises four stations, shown as STN1, STN2, STN3, and STN4. The prior art operation of the chamber is first described. Then the operation of the chamber as taught by an embodiment of the present invention is described.

PRIOR ART OPERATION

When operated in accordance with the prior art, a wafer is placed on the loading platform 10 and then loaded onto the station 1. This is shown as step 20 in FIG. 2A. Then a deposition occurs at station 1, for instance, one-fourth of a total desired layer thickness is applied at station 1. Deposition occurs at the other stations even though at this time, there are no wafers at the other stations. This is shown by step 21 of FIG. 2A.

Next, the wafer is indexed, that is, the wafer at station 1 is moved to station 2, and another wafer is loaded onto station 1. Again, a deposition occurs of, for instance, one-fourth the total desired layer thickness is deposited at all stations and thus the wafer at stations 1 and 2 are processed.

Once again, indexing occurs and the wafers are advanced. Specifically, the wafer at station 1 is moved to station 2, and the wafer at station 2 is moved to station 3. Note, the wafers are moved from station-to-station simultaneously. The spindles on which the wafers rest are all rotated about a centrally disposed axis. Another wafer is now loaded onto station 1. Next another deposition occurs. As with the other deposition steps one-fourth of a total film thickness is again deposited.

Indexing again occurs with the wafer from station 1 moved to station 2, the wafer at station 2 moved to station 3, and the wafer at station 3 moved to station 4. Another wafer is now loaded into station 1. A deposition step occurs (step 23 of FIG. 2A).

Figure 2A:
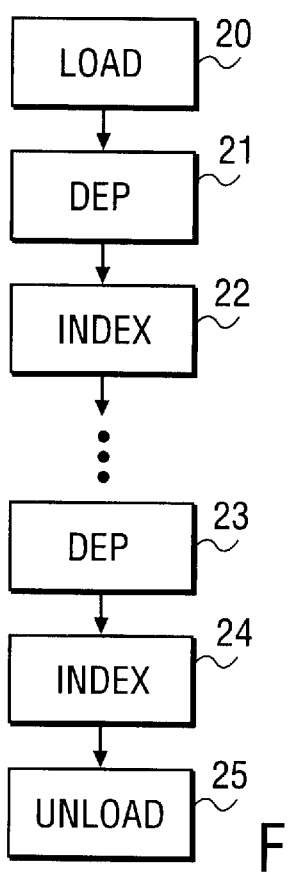
FIG. 2A is a flow diagram illustrating the process flow for the chamber of FIG. 1 as practiced in the prior art.

Once again the wafers are indexed with the wafer at station 1 moved to station 2, the wafer at station 2 moved to station 3, the wafer at station 3 moved to station 4, and the wafer at station 4 moved to station 1 (step 24 of FIG. 2A). After the wafer at station 1 is removed onto platform 12 another wafer is loaded from the platform 10 onto station 1, another deposition occurs.

The process continues with deposition occurring at each of the stations, for instance, each of the stations are located beneath a "showerhead" which provides material for depositing onto the wafer, such as occurs with the chemical vapor deposition of silicon dioxide.

Figures 3A, 3B:
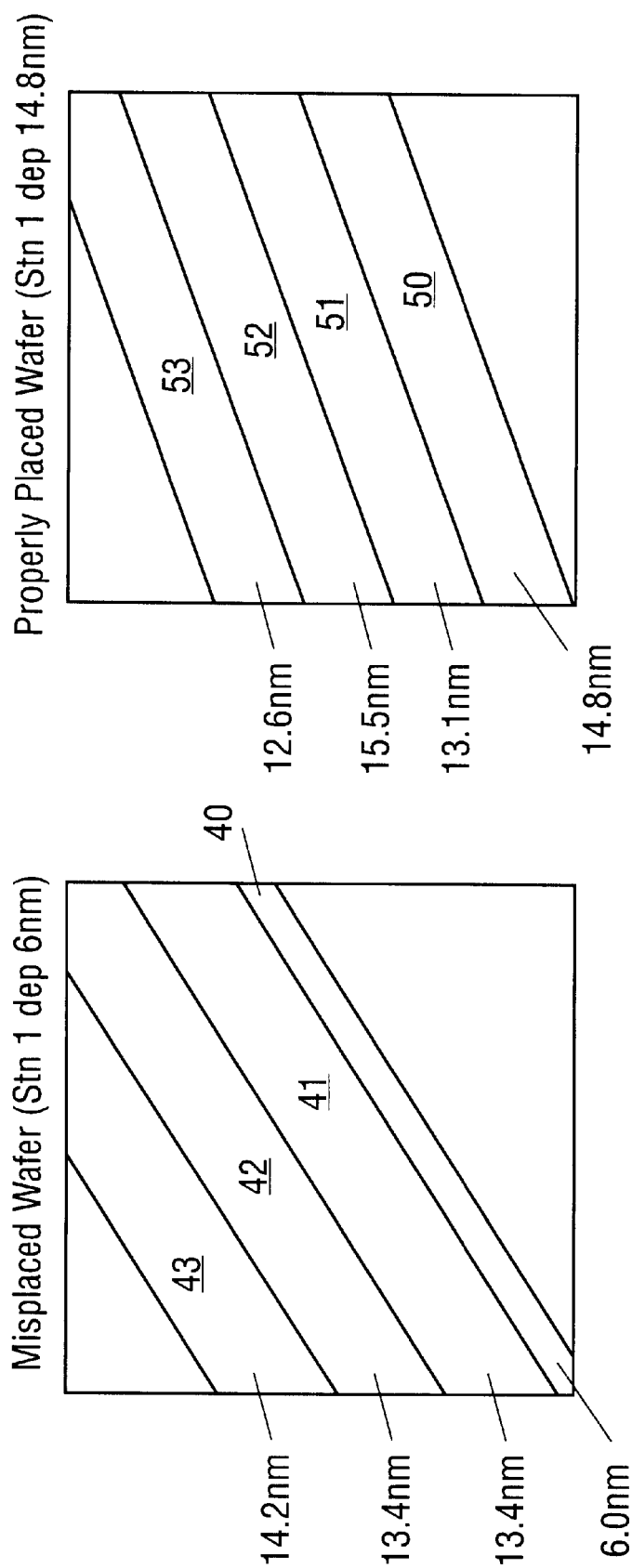
FIG. 3A is a representation of a scanning electron microscope view of several layers formed with the chamber of FIG. 1 with a misplaced wafer at the first station.
FIG. 3B is a representation of a scanning electron microscope view of several layers formed with chamber of FIG. 1 with a properly placed wafer.

A problem that occurs is that in some instances, when a wafer is loaded from the platform 10 onto station 1, it does not align itself completely with the spindle of station 1. When this happens, the deposition at station 1 is typically less than the target thickness of approximately one-fourth the total film thickness. This is shown in FIG. 3A under the heading "misplaced wafer" where at station 1, a deposition of 6 nm is shown as the thickness for the film 40.

When the wafer is indexed from station 1 to station 2, the rotational movement from one station to the next causes the wafer to become properly seated on the spindle. Thus, in subsequent depositions within the chamber, the desired thickness is achieved. For instance, the material deposited at station 2 is shown by film 41 (13.4 nm), the material deposited at station 3 as film 42, (13.4 nm), and the material deposited at station 4 as film 43 (14.2 nm). This uniform deposition at stations 2, 3, and 4 demonstrates that once indexed, the wafers sit well on the spindle and uniform depositions occur throughout the remainder of the processing.

OVERVIEW OF OPERATION OF THE CHAMBER IN ACCORDANCE WITH AN EMBODIMENT OF THE PRESENT INVENTION

Figure 2B:
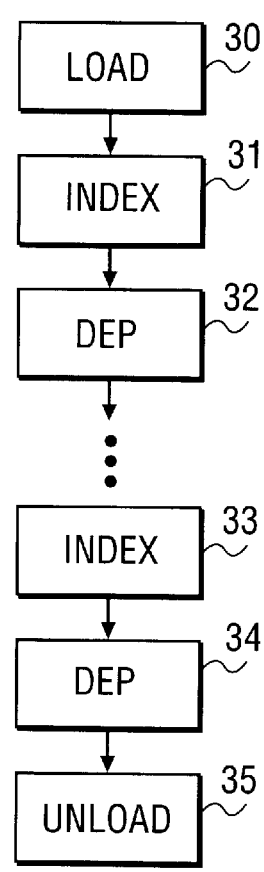
FIG. 2B is a flow diagram illustrating the process flow for the chamber of FIG. 1 operating in accordance with an embodiment of the present invention.

In an embodiment of the present invention, the misalignment or misplacement problem described above is solved by first indexing the wafer before deposition occurs. For instance, assume that the chamber of FIG. 1 is empty and that a first wafer is loaded from platform 10 onto station 1, as shown by step 30 of FIG. 2B.

Now, indexing occurs with the wafer from station 1 being moved to station 2 before any deposition occurs as shown by step 31. Note, this is in contrast to the operation of the prior art, where deposition occurs at station 1 before indexing. Deposition now occurs with one-fourth the total films thickness being deposited on the wafer at station 2, as shown by step 32.

Next, a second wafer is loaded onto station 1 and indexing again occurs before deposition. That is, the wafer from station 1 is moved to station 2 and the wafer from station 2 is moved to station 3. Deposition now occurs.

A third wafer is next loaded onto station 1 and indexed by moving the third wafer to station 2, the second wafer to station 3, and the first wafer to station 4. Following this, deposition occurs.

Next, a fourth wafer is placed onto station 1. As shown by step 33 of FIG. 2B, indexing occurs, such that the fourth wafer is moved to station 2, the third wafer to station 3, the second wafer to station 4 and the first wafer to station 1. (As mentioned, the indexing occurs simultaneously, and consequently a wafer can be moved from station 1 to station 2 while another wafer is moved onto station from station 4. This is true for all the stations.) Following the indexing, a deposition step occurs as shown by step 34 of FIG. 2. Then, as shown by step 35, the first wafer is removed onto platform 12, and another wafer, the fifth wafer, is loaded from platform 10 onto station 1.

The process continues with deposition occurring at all four stations after indexing. Thus, in summary, comparing the prior method to the new method as discussed above, an unindexed wafer is not processed at station 1, rather the processing occurring at station 1 is of a wafer indexed onto station 1 from station 4. In this manner, all processing occurs on wafers that have been first indexed, and consequently, all wafers are well aligned on their respective spindles when deposition occurs.

Comparing FIG. 3A with FIG. 3B, the deposition occurring at each of the stations 1, 2, 3 and 4 are shown by the films 50, 51, 52, and 53 respectively, in FIG. 3B. When the wafer is properly seated on the spindle, all the film thicknesses are approximately equal. Comparing the thickness of film 40 to the thickness of film 50 of FIGS. 3A and 3B, respectively, the thickness of film 50 is consistent with the thicknesses formed at the other stations.

DETAILED DESCRIPTION OF AN EMBODIMENT HAVING FOUR STATIONS

In Table 1 below, a wafer path for the chamber of FIG. 1 is shown for an embodiment of the present invention. Note all wafers follow this path.

Initially, a wafer is transferred to the load lock, specifically the platform 10 of FIG. 1. From there, the wafer is transferred into the CVD chamber. The wafer is indexed from station 1 to station 2. In so indexing, the wafer becomes well seated. Then one-fourth of the deposition occurs at station 2.

The wafer is repeatedly indexed and one-fourth the target film thickness deposited at each of the stations 2, 3, 4 and 1. (This description follows the course of a single wafer, as described above other wafers follow. Thus as the wafer is moved to station 3 another wafer follows onto station 2). In practice, all the "showerheads" operate for each deposition step even if the chamber is not yet filled with wafers.

TABLE 1

Wafer Path

Transfer to Load Lock
Transfer to CVD chamber
index
¼ dep station 2
index
¼ dep station 3
index
¼ dep station 4
index
¼ dep station 1
Transfer to Load Lock In the prior art, once a wafer is transferred to station 1, the pedestal on which the wafer rests is lowered for processing to occur. Then there is a ramping of the gases into the chamber and a ramping up to the reaction conditions, and if need be, a soak. Next, pre-treatment steps occur when used. Then, the actual deposition of one-fourth of the film thickness takes place. Following this, the residual gases are pumped from the chamber, and the wafer is rinsed. Now the wafer is indexed to the next station.

With an embodiment of the present invention as shown in Table 2 below, first the wafer is transferred from the load lock onto the first station. Now indexing occurs. As indexing occurs from one station to the next, the ramping of pressures and flows to the chamber occurs. Thus, these two functions (indexing and ramping) overlap and are done simultaneously. Once the wafer has been indexed and is at the next station, the pedestal is lowered followed by any pre-treatment steps, and finally the film deposition to one-fourth the film thickness. Then, as in the prior art, the residual gases are pumped from the chamber and the wafers are rinsed. Following this, the wafers are indexed to the next station while ramping occurs. Since the indexing occurs at the same time as the chamber is brought to its reaction conditions, this results in an improved run-rate of one to two wafers per hour in practice.

TABLE 2

Deposition Sequence in CVD Chamber

Transfer wafer
Index wafer/Ramp pressure and flows
to reaction conditions
Lower wafer onto pedestal (Soak if
needed)
Run Pretreatment Step
Deposit ¼ of film thickness
Pump out residual gases
Raise wafers
Index wafer/Ramp pressure and flows
to reaction conditions In an alternative embodiment, a first wafer is loaded and indexed. Then before any deposition, a second wafer is loaded and indexed. Now a third wafer is loaded and indexed, and then a fourth wafer is loaded and indexed. After all four wafers are loaded and indexed, deposition occurs in a single step to deposit the entire layer thickness. The pressure and flows may be ramped during the fourth indexing.

Thus, an improved method for operating a chamber, such as a CVD chamber, is described. By advancing the wafers before deposition is started, a misplaced wafer will be seated properly before its first deposition. In addition, the indexing step can be combined with a pressure and flow ramp and any soak time needed to allow for pressure and flow stabilization.

What is claimed is:

1. A method for operating a processing chamber having multiple stations, comprising:

loading a wafer onto a first station, indexing the wafer to a second station prior to processing the wafer at the first station, processing the wafer at the second station, indexing the wafer and processing the wafer at each of the other stations, indexing the wafer onto the first station, processing the wafer at the first station.

2. The method defined by claim 1, wherein the processing occurring at each station is a deposition.

3. The method defined by claim 1, wherein the wafer is unloaded from the first station after the processing at the first station.

4. The method defined by claim 3, wherein another wafer is loaded into the first station after the unloading.

5. A method for operating a multi-station deposition chamber where wafers are loaded and unloaded into the chamber at a first station, comprising:

loading a wafer into the first station, and indexing the wafer to a second station before deposition occurs at the first station.

6. The method defined by claim 5, including depositing at the first station before unloading the wafer from the first station.

7. The method defined by claim 6, including ramping gas flows to the chamber during the indexing.

8. The method defined by claim 4, including ramping gas flow to the chamber before the indexing.

9. A method for operating a deposition chamber having four deposition stations, comprising:

loading a first wafer into a first station, first indexing the first wafer to a second station prior to deposition occurring on the wafer at the first station, and depositing material in a first deposition in the chamber.

10. The method defined by claim 9, including additionally:

loading a second wafer into the first station, second indexing the first wafer to a third station, and the second wafer to a second station prior to deposition occurring at the first, second, or third stations, and depositing material in a second deposition.

11. The method defined by claim 10, including:

loading a third wafer into the first station, third indexing the first wafer to the fourth station, the second wafer to the third station, and the third wafer to the second station prior to deposition occurring, and depositing material in a third deposition.

12. The method defined by claim 11, including:

loading a fourth wafer onto the first station, fourth indexing the first wafer to the first station, the second wafer to the fourth station, the third wafer to the third station and the fourth wafer to the second station, depositing material in a fourth deposition.

13. The method defined by claim 12, including:

unloading the first wafer from the first station, loading a fifth wafer into the first station, fourth indexing the second wafer to the first station, the third wafer to the fourth station, the fourth wafer to the third station and the fifth wafer to the second station, prior to deposition, and depositing material in a fifth deposition step.

14. The method defined by claim 9, wherein during the first indexing, ramping of gas flows to the chamber occurs.

15. The method defined by claim 10, wherein during the second indexing, ramping of gas flows to the chamber occurs.

16. The method defined by claim 11, wherein during the third indexing, ramping of gas flows to the chamber occurs.

17. The method defined by claim 12, wherein during the fourth indexing, ramping of gas flows to the chamber occurs.

18. The method defined by claim 13, wherein during the fifth indexing, ramping of gas flows to the chamber occurs.

19. The method defined by claim 9, wherein during the first deposition approximately one-fourth of a layer of predetermined thickness is deposited.

20. The method defined by claim 10, wherein during the second deposition, approximately one-fourth of the layer of predetermined thickness is deposited.

21. The method defined by claim 11, wherein during the third deposition, approximately one-fourth of the layer of predetermined thickness is deposited.

22. The method defined by claim 12, wherein during the fourth deposition approximately one-fourth of the layer of predetermined thickness is deposited.

23. The method defined by claim 13, wherein during the fifth deposition approximately one-fourth of the layer of predetermined thickness is deposited.

24. A method for operating a processing chamber having multiple stations, comprising:

loading and indexing wafers until all the stations have a wafer that has been indexed, prior to any deposition occurring; and depositing material on the wafer at all the stations.

25. The method defined by claim 24 including ramping gas flows while a last one of the wafers is indexed.

* * * * *